US012676454B2

(12) United States Patent
Ueda et al.

(10) Patent No.: US 12,676,454 B2
(45) Date of Patent: Jul. 7, 2026

(54) TUNABLE LASER DIODE

(71) Applicant: NTT, Inc., Tokyo (JP)

(72) Inventors: Yuta Ueda, Tokyo (JP); Mitsuteru Ishikawa, Tokyo (JP)

(73) Assignee: NTT, Inc., Tokyo (JP)

(*) Notice: Subject to any disclaimer, the term of this patent is extended or adjusted under 35 U.S.C. 154(b) by 853 days.

(21) Appl. No.: 17/926,462

(22) PCT Filed: May 25, 2020

(86) PCT No.: PCT/JP2020/020600
§ 371 (c)(1),
(2) Date: Nov. 18, 2022

(87) PCT Pub. No.: WO2021/240614
PCT Pub. Date: Dec. 2, 2021

(65) Prior Publication Data
US 2023/0187903 A1     Jun. 15, 2023

(51) Int. Cl.
*H01S 5/062*     (2006.01)
*H01S 5/0625*     (2006.01)
*H01S 5/10*     (2021.01)

(52) U.S. Cl.
CPC .......... *H01S 5/062* (2013.01); *H01S 5/06256* (2013.01); *H01S 5/1039* (2013.01)

(58) Field of Classification Search
CPC .. H01S 5/06256; H01S 5/1007; H01S 5/1092; H01S 5/06246; H01S 5/1039
See application file for complete search history.

(56) References Cited

U.S. PATENT DOCUMENTS

| | | | | |
|---|---|---|---|---|
| 6,101,210 A | * | 8/2000 | Bestwick | ............ H01S 5/02325 |
| | | | | 372/98 |
| 6,434,175 B1 | * | 8/2002 | Zah | ....................... H01S 5/4025 |
| | | | | 372/20 |

(Continued)

FOREIGN PATENT DOCUMENTS

| | | | | |
|---|---|---|---|---|
| CN | 103580752 A | * | 2/2014 | |
| JP | 2014191088 A | * | 10/2014 | |

(Continued)

OTHER PUBLICATIONS

Yuta Ueda, Takahiro Shindo, Shigeru Kanazawa, Naoki Fujiwara, and Mitsuteru Ishikawa, *Electro-Optically Tunable Laser With <10-mW Tuning Power Dissipation and High-Speed λ-Switching for Coherent Network*, in Proc. of ECOC2019, PD.2.2., pp. 1-4, (2019).

(Continued)

*Primary Examiner* — Joshua King
(74) *Attorney, Agent, or Firm* — Workman Nydegger

(57) ABSTRACT

An oscillation wavelength adjustment type TLD for adjusting a control amount of a resonator length L, independently from physical property values of a waveguide material when a waveguide is used in the phase adjustment, without an external resonator structure in accordance with a MEMS technology employs a reflective phase adjuster including a multi-mode interference waveguide, which is optically coupled to an optical gain waveguide and has a configuration including one input port and five output ports, and a reflective delay line array connected to an output waveguide on a side of the five output ports of the multi-mode interference waveguide. Five reflective delay lines provided in the reflective delay line array are capable of adjusting the intensity of reciprocating light in accordance with a wavelength change of transmitted light.

3 Claims, 8 Drawing Sheets

(56)        References Cited

U.S. PATENT DOCUMENTS

|  |  |  |  |  |
|---|---|---|---|---|
| 6,571,031 B1 * | 5/2003 | Augustsson | .............. | G02B 6/34 |
|  |  |  |  | 385/47 |
| 10,038,301 B1 * | 7/2018 | Eggleston | ............. | H01S 5/0657 |
| 2002/0006249 A1 * | 1/2002 | Augustsson | ........ | H04J 14/0213 |
|  |  |  |  | 385/24 |
| 2003/0035446 A1 * | 2/2003 | Griffel | ................... | H01S 5/141 |
|  |  |  |  | 372/99 |
| 2005/0053322 A1 * | 3/2005 | Jenkins | ................ | G02B 6/2813 |
|  |  |  |  | 385/22 |
| 2005/0243874 A1 * | 11/2005 | Paoletti | .................... | H01S 5/50 |
|  |  |  |  | 372/20 |
| 2010/0020840 A1 * | 1/2010 | Hayakawa | ................ | H01S 5/12 |
|  |  |  |  | 372/50.11 |
| 2013/0235890 A1 * | 9/2013 | Creazzo | ................. | H01S 5/142 |
|  |  |  |  | 372/20 |
| 2015/0023382 A1 * | 1/2015 | Schell | .................... | H01S 5/068 |
|  |  |  |  | 372/96 |
| 2015/0207291 A1 * | 7/2015 | Rickman | ............. | H01S 3/08027 |
|  |  |  |  | 372/20 |
| 2015/0207296 A1 * | 7/2015 | Rickman | ................. | H01S 5/021 |
|  |  |  |  | 372/20 |
| 2016/0294158 A1 * | 10/2016 | Chen | ..................... | H01S 5/3013 |
| 2017/0163008 A1 * | 6/2017 | Guo | ...................... | H01S 5/0653 |

FOREIGN PATENT DOCUMENTS

|  |  |  |  |  |  |  |
|---|---|---|---|---|---|---|
| JP |  | 2015184593 A | * | 10/2015 |  |  |
| JP |  | 2019082633 A | * | 5/2019 |  |  |
| KR |  | 100576712 B1 | * | 5/2006 | ............ | H01S 5/146 |
| WO | WO-2017131879 A1 | * | 8/2017 | .......... | H01S 5/0265 |

OTHER PUBLICATIONS

Masanori Nakahama, Takahiro Sakaguchi, Akihiro Matustani, and Fumio Koyama, *Athermal and Widely Tunable VCSEL with Bimorph Micromachined Mirror*, Optics Express, vol. 22, p. 21471 (2014).

* cited by examiner

TUNABLE LASER DIODE

TECHNICAL FIELD

The present invention relates to an oscillation wavelength adjustment type tunable laser diode (hereinafter referred to as "TLD") capable of freely adjusting an oscillation wavelength within a certain range.

BACKGROUND ART

TLDs belonging to optical devices are widely used conventionally in applications such as carrier wave light sources for optical communication and gas sensing. One important characteristic provided in such a TLD is that it is possible to achieve a large magnitude of continuous adjustments of an oscillation wavelength within a certain range. To provide such a characteristic, a configuration is adopted in which an optical device is assembled so as to form a laser resonator structure for a TLD.

FIG. 1 is a block diagram illustrating a basic configuration of a well-known oscillation wavelength adjustment type TLD 10 having a laser resonator structure. Referring to FIG. 1, the oscillation wavelength adjustment type TLD 10 is configured as a laser resonator structure in which an optical gain waveguide 1, a phase adjuster 2, and a variable wavelength filter 3 are interposed between two mirrors M1 and M2 and optically coupled to each other. Here, the optical gain waveguide 1 serves to amplify light generated by a laser. The phase adjuster 2 finely adjusts a resonator length L of the laser resonator structure. The resonator length L corresponds to a length of the oscillation wavelength adjustment type TLD 10. The variable wavelength filter 3 serves to selectively feed back light of a specific wavelength for light from the optical gain waveguide 1.

Note that, in some types of the variable wavelength filter 3, a filter configuration for adjusting the reflection spectrum, such as a distributed Bragg reflector (DBR), is often used. In this case, the variable wavelength filter 3 also serves as the mirror M2.

FIG. 2 is a set of graphs showing characteristics of a longitudinal mode gain A of a light feedback rate by the function of the wavelength-variable filter 3 and a longitudinal mode gain B for a tunable laser, with respect to wavelengths shown for explanation of a wavelength selection principle in the oscillation wavelength adjustment type TLD 10 of FIG. 1.

The characteristics of the longitudinal mode gain A can be regarded as the reflectance spectrum of light when viewed from the optical gain waveguide 1, and thus, show a gain spectrum divided into a wavelength selection spectrum C1 of a function of a wavelength-variable filter and a longitudinal mode gain C2 reflecting the resonator length L. In contrast, when light generates a standing wave (longitudinal mode) at the resonator length L of the oscillation wavelength adjustment type TLD 10, the characteristics of the longitudinal mode gain B indicate an oscillation mode C3 of the entire tunable laser at which the light experiences a large gain from the optical gain waveguide 1.

A wavelength of a longitudinal mode is generally expressed by Relational Equation (1) below:

Math. 1

$$\sum_k n_k L_k = \frac{m\lambda}{2} \tag{1}$$

Here, $\lambda$ is a wavelength of light and m and k are positive integers (natural numbers).

Note that in this Relational Equation (1), $n_k$ is a refractive index of each constitution element included in the oscillation wavelength adjustment type TLD 10, and $L_k$ is a physical length of each constitution element included in the oscillation wavelength adjustment type TLD 10.

That is, for the oscillation wavelength adjustment type TLD 10 illustrated in FIG. 1, the refractive index $n_k$ and the physical length $L_k$ of the optical gain waveguide 1, the phase adjuster 2, the variable wavelength filter 3, and the waveguide connecting these are indicated. Relational Equation (1) indicates that, when light reciprocates in an optical path length of the oscillation wavelength adjustment type TLD 10, optical phases of the light match.

When a laser serving as a light source is a semiconductor laser, the resonator length L is several hundred $\mu$m, except for some special lasers. On the other hand, a typical value of the wavelength of light of the semiconductor laser is 1.55 $\mu$m, which is a value often used in optical communication, for example. As can be seen from Relational Equation (1) above, an infinite number of integers m (hereinafter referred to as "longitudinal mode order") exists, and thus, it is necessary to further select a specific longitudinal mode and feed the selected specific longitudinal mode back to the optical gain waveguide 1 in order to oscillate the TLD 10 at a single wavelength.

Thus, as shown in the characteristics of the oscillation mode C3 according to the longitudinal mode gain B, if the function of the variable wavelength filter 3 that selectively feeds back light of a specific wavelength is provided in the oscillation wavelength adjustment type TLD 10, it is possible to select a specific longitudinal mode. The adjustment by the function of the variable wavelength filter varies depending on the filter type, but in the adjustment of the longitudinal mode, as seen from Relational Equation (1) above, it is only required to adjust the optical path length in the oscillation wavelength adjustment type TLD 10. The phase adjuster 2 is used to adjust the optical path length. That is, when a case of k=1 is assumed to be for the phase adjuster 2 in Relational Equation (1), it is only required to adjust the refractive index $n_k$.

As described above, if the longitudinal mode wavelength and the function of the variable wavelength filter 3 are appropriately controlled in the oscillation wavelength adjustment type TLD 10, it is possible to oscillate light of any wavelength. Here, the continuous adjustment amount of the wavelength of the TLD 10 indicates an adjustment range changeable without changing the longitudinal mode order m. In a laser oscillating at a certain longitudinal mode order m, if the function of the wavelength-variable filter 3 is adjusted so as to select, for example, a longitudinal mode order of m+1, a large wavelength change is obtained.

The change of the longitudinal mode order m is called a mode hop, and before and after the mode hop, the light intensity is unstable and the spectral purity deteriorates. For example, in gas sensing in which light from the TLD 10 being a wavelength-swept is passed through gas to identify a gas species from a transmission spectrum of the light, if a mode hop occurs during wavelength sweeping, the continuity of the transmission spectrum is impaired and analysis is difficult.

In addition, when the TLD 10 is used as an athermal laser, a continuous adjustment amount of the wavelength of the TLD 10 is also important in a method of compensating a change in laser oscillation wavelength due to a temperature change, by an electric signal to the TLD 10. Although athermalization of a laser is very useful for reducing the size of laser modules and power consumption, when a mode hop occurs during an operation, the communication quality may be significantly impaired.

In order to increase the continuous adjustment amount of the wavelength of the TLD 10, it is necessary to increase both the adjustment amount of the function of the variable wavelength filter 3 and the adjustment amount of the phase adjuster 2 that controls the longitudinal mode in the constitution elements of the oscillation wavelength adjustment type TLD 10 illustrated in FIG. 1. In the case of the TLD 10 being a waveguide type TLD, if a refractive index of a semiconductor used as a resonator material is controlled by injecting carriers into the semiconductor or by local heating, it is often possible to adjust the spectrum by the function of the wavelength-variable filter 3 and the resonator length L by the phase adjuster 2. However, these adjustment amounts are limited by physical property values.

Thus, a technique for improving the adjustment of the function of the variable wavelength filter 3 includes, in addition to changing the refractive index of the waveguide material, a technique for expanding a wavelength-variable width in the design of a waveguide structure (NPL 1). With such a method in NPL 1, it is possible to obtain a large spectral change in the function of the wavelength-variable filter 3 in the TLD 10, that does not depend on physical property values of a filter material of the wavelength-variable filter 3.

However, in the method in NPL 1, as seen from Relational Equation 1 above, the phase adjuster 2 depends on the physical quantity $L_k$ and the refractive index $n_k$ of each constitution element included in the oscillation wavelength adjustment type TLD 10. Thus, according to the method in NPL 1, there is still a limit to the adjustment amount of the phase adjuster 2.

Thus, in recent years, a technique for controlling the resonator length L (NPL 2) is drawing attention for external resonator lasers using movable mirrors in accordance with a micro electro mechanical systems (MEMS) technology. However, the MEMS technology has typical problems such as weakness against mechanical vibration, a slow adjustment speed, and a large control voltage.

That is, the oscillation wavelength adjustment type TLD 10 known in the art employs at least one of the following methods: using an external resonator structure in accordance with the MEMS technology having the problems described above, or utilizing the dependence on the physical property values of the waveguide material in a limited waveguide-type phase adjustment. This adjusts the control amount of the resonator length L, which is a limiting factor of the continuous adjustment amount of the wavelength.

CITATION LIST

Non Patent Literature

NPL 1: Yuta Ueda, Takahiro Shindo, Shigeru Kanazawa, Naoki Fujiwara, and Mitsuteru Ishikawa. "ELECTRO-OPTICALLY TUNABLE LASER with <10-mW TUN-ING POWER DISSIPATION AND HIGH-SPEED λ-SWITCHING FOR COHERENT NETWORK", in Proc. of ECOC 2019, PD. 2.2.

NPL 2: Masanori Nakahama, Takahiro Sakaguchi, Akihiro Matustani, and Fumio Koyama "Athermal and widely tunable VCSEL with bimorph micromachined mirror", Optics Express, vol. 22, p. 21471 (2014).

SUMMARY OF THE INVENTION

The present invention is intended to solve the above-described issues. An object of an embodiment according to the present invention is to provide an oscillation wavelength adjustment type TLD capable of adjusting a control amount of a resonator length, independently from physical property values of a waveguide material when a waveguide is used in the phase adjustment, without using an external resonator structure in accordance with the MEMS technology.

In order to achieve the object described above, an oscillation wavelength adjustment type TLD according to one aspect of the present invention includes: an optical gain waveguide configured to generate and amplify light; a multi-mode interference waveguide configured to include M input ports and N output ports (where M is a natural integer and N is a positive integer equal to or greater than 2); and a reflective delay line array including N reflective delay lines connected to a side of the N output ports of the multi-mode interference waveguide and terminated by a mirror configured to reflect the light. The optical gain waveguide, the multi-mode interference waveguide, and the reflective delay line array are integrated on a top surface of an identical substrate. The N reflective delay lines are configured to adjust an intensity of reciprocating light in accordance with a wavelength change of the light transmitted through the N reflective delay lines.

According to the configuration of the aspect described above, a reflective phase adjuster including a multi-mode interference coupler and a reflective delay line array can be applied as a phase adjuster constituting the oscillation wavelength adjustment type TLD. Thus, in an oscillation wavelength adjustment type TLD including the above integrated components, in a plurality of reflective delay lines included in the reflective delay line array, it is possible to adjust the intensity of reciprocating light in accordance with a wavelength change of light transmitted through the plurality of reflective delay lines. As a result, it is possible to adjust a control amount of a resonator length L, independently from physical property values of the waveguide material when a waveguide is used in the phase adjustment, without using an external resonator structure in accordance with the MEMS technology as in the known art.

DESCRIPTION OF EMBODIMENTS

TLDs according to some embodiments of the present invention will be described in detail below with reference to the drawings.

Firstly, a technical overview of an oscillation wavelength adjustment type TLD according to an embodiment of the present invention will be described. The oscillation wavelength adjustment type TLD is configured as a laser resonator structure in which an optical gain waveguide, a multi-mode interference waveguide, and a reflective delay line array including a plurality of reflective delay lines are integrated on a top surface of the same substrate.

Figure 1:
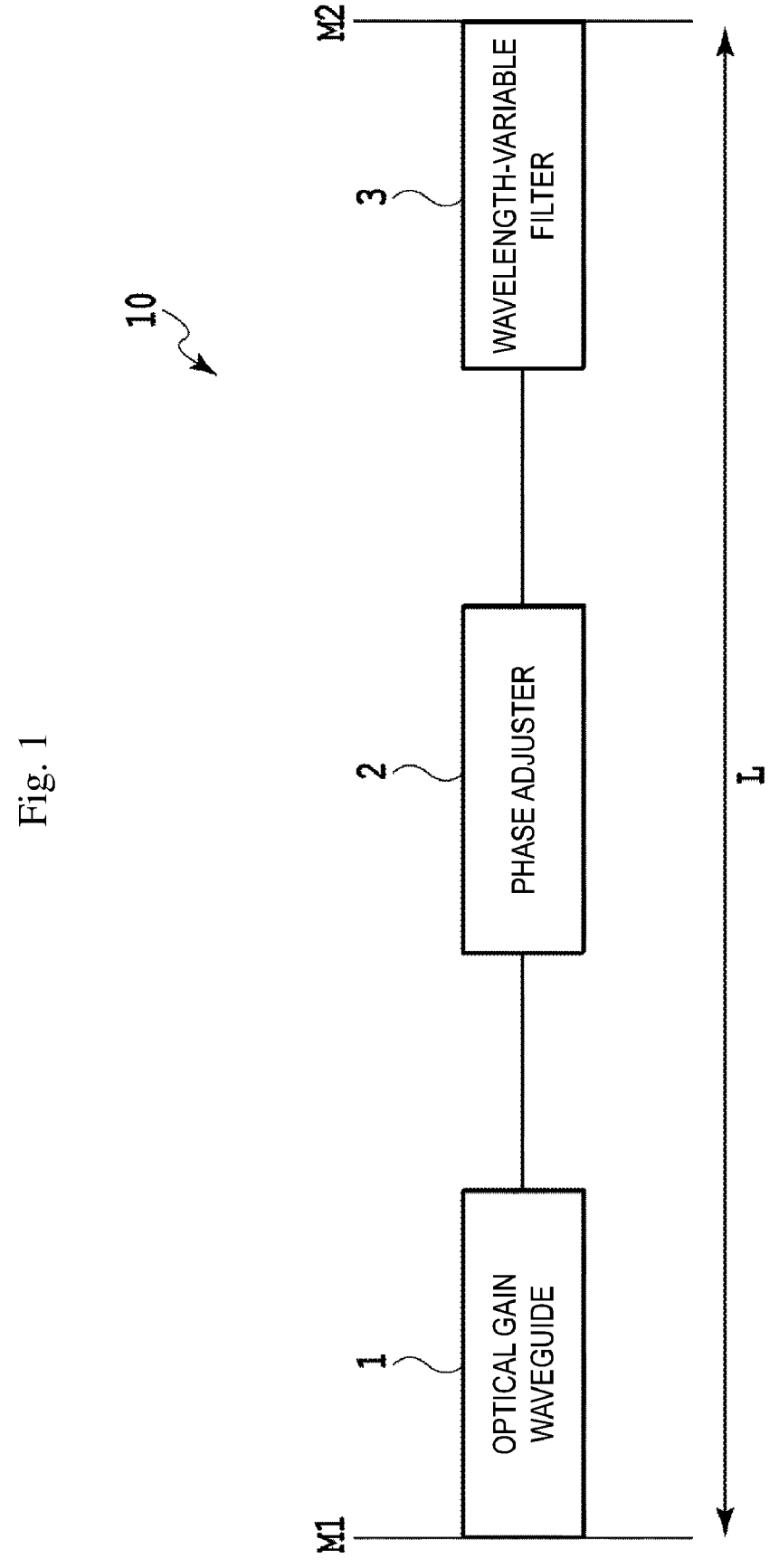
FIG. 1 is a block diagram illustrating a basic configuration of a well-known oscillation wavelength adjustment type TLD having a laser resonator structure.
Figure 2:
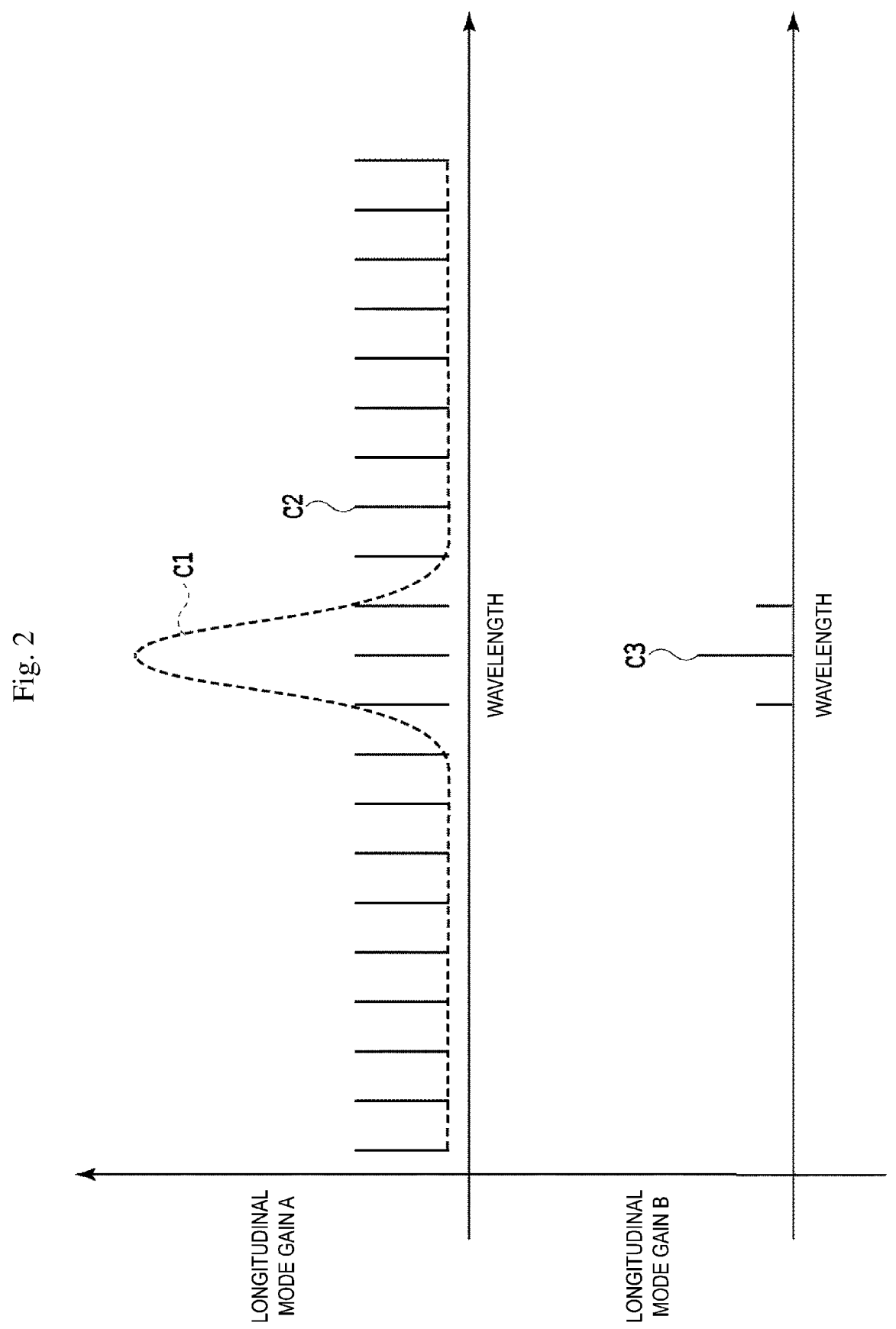
FIG. 2 is a set of graphs showing characteristics of a longitudinal mode gain of a light feedback rate by a function of a wavelength-variable filter and a longitudinal mode gain for a tunable laser, with respect to wavelengths shown for explanation of a wavelength selection principle in the oscillation wavelength adjustment type TLD of FIG. 1.

Similarly to the case described in FIG. 1, the optical gain waveguide has a function for generating and amplifying light. The multi-mode interference waveguide is configured to include M input ports and N output ports (where M is a natural integer and N is a positive integer equal to or greater than 2), and can be applied as a multi-mode interference coupler, for example. The reflective delay line array includes N reflective delay lines connected to a side of the N output ports of the multi-mode interference waveguide and terminated by mirrors that reflect light. Furthermore, the reflective delay lines of the reflective delay line array are capable of adjusting the intensity of reciprocating light in accordance with a wavelength change of light transmitted through the reflective delay lines. The intensity of the reciprocating light can also be adjusted by an electric signal applied from the outside. The reflective delay line array using the plurality of reflective delay lines and the multi-mode interference coupler form together a reflective phase adjuster. The oscillation wavelength adjustment type TLD may be regarded as a TLD in which a wavelength adjuster 2 in the configuration of FIG. 1 is replaced with such a reflective phase adjuster.

In the oscillation wavelength adjustment type TLD thus configured, a reflective phase adjuster using a reflective delay line array including a plurality of reflective delay lines can be used in combination with a multi-mode interference coupler. Furthermore, in the plurality of reflective delay lines included in the reflective delay line array, it is possible to adjust the intensity of reciprocating light in accordance with a wavelength change of light transmitted through the plurality of reflective delay lines. This makes it possible to adjust a control amount of a resonator length L, being a control factor of a continuous adjustment amount of the wavelength, independently from physical property values of the waveguide material when a waveguide is used in the phase adjustment, without using an external resonator structure in accordance with the MEMS technology. Specific examples of an oscillation wavelength adjustment type TLD using such a reflective phase adjuster will be described below with reference to some embodiments.

First Embodiment

Figure 3:
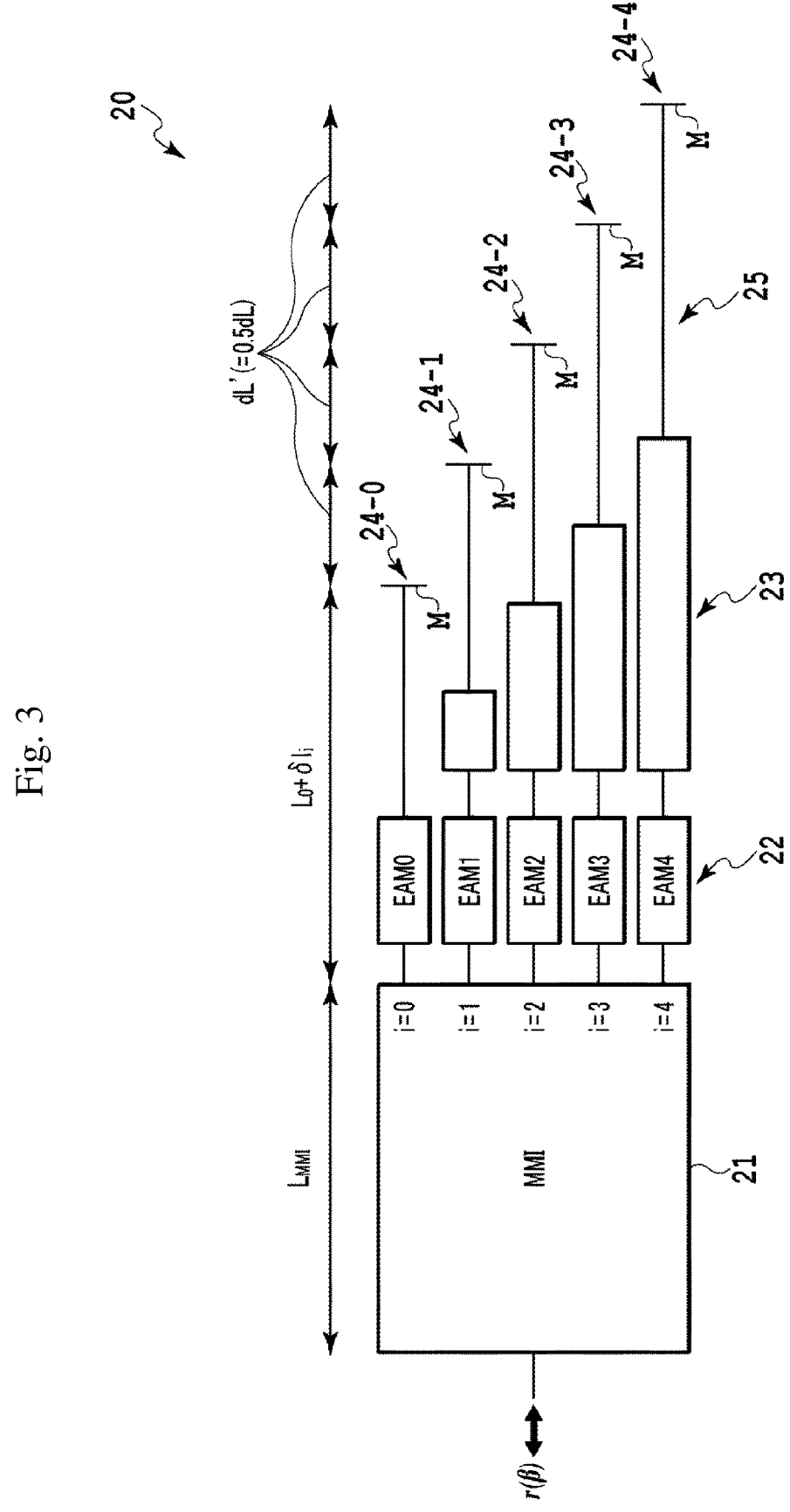
FIG. 3 is a schematic diagram illustrating a schematic configuration of a reflective phase adjuster used in an oscillation wavelength adjustment type TLD according to a first embodiment of the present invention.

FIG. 3 is a schematic diagram illustrating a schematic configuration of a reflective phase adjuster 20 used in an oscillation wavelength adjustment type TLD according to a first embodiment of the present invention.

Referring to FIG. 3, the reflective phase adjuster 20 includes a multi-mode interference waveguide (MMI) 21 that is optically coupled to the optical gain waveguide 1 illustrated in FIG. 1 and is configured to include one input port and five output ports (that is, M input=1 and N output=5). Furthermore, the reflective phase adjuster 20 includes a reflective delay line array 25 connected to an output waveguide on a side of the five output ports of the multi-mode interference waveguide (MMI) 21. The reflective delay line array 25 includes five reflective delay lines 24-0, 24-1, 24-2, 24-3, and 24-4 having a length different from each other and being provided with a mirror M at terminal parts thereof. Note that the five output ports are identified by identifier i=0, 1, 2, 3, 4.

The reflective delay lines 24-0, 24-1, 24-2, 24-3, and 24-4 include electro-absorption modulators (EAM-0 to EAM-4) 22 that adjust the intensity of light reciprocating in each of the reflective delay lines 24-0, 24-1, 24-2, 24-3, and 24-4. Furthermore, reflection spectrum adjustment electrodes 23 are interposed between the mirrors M at the terminal parts of the reflective delay lines 24-1, 24-2, 24-3, and 24-4 and the electro-absorption modulators (EAM-1 to EAM-4) 22. In the reflective phase adjuster 20 employed in the oscillation wavelength adjustment type TLD according to the first embodiment, a case where M input=1 and N output=5 is illustrated, but other numbers of N input and M output may be employed.

A complex transmittance of light transmitted through the multi-mode interference waveguide (MMI) 21 having length $L_{MMI}$ and one input port and five output ports is represented by Expression (2) below.

Math. 2

$$\frac{1}{\sqrt{5}}\exp(-j\beta L_{MMI} + j\varphi_i) \tag{2}$$

Note that in Expression (2), $\beta$ is a propagation constant of a base mode of the multi-mode interference waveguide (MMI) 21. Furthermore, $\psi_i$ reflects a transfer function of the multi-mode interference waveguide (MMI) 21 and represents a relative phase relationship of the light coupled to the reflective delay line 24-0, 24-1, 24-2, 24-3, and 24-4 of the identifier i. This relative phase relationship $\psi_i$ can be compensated by adding a small length (corresponding to $\delta l_i$ illustrated in FIG. 3) to the reflective delay line 24-0, 24-1, 24-2, 24-3, and 24-4 of the identifier i, and thus, the relative phase relationship $\psi_i$ is assumed to be zero hereinafter. Note that such a method is also described in NPL 1 mentioned above.

As illustrated in FIG. 3, the length of each of the reflective delay lines 24-0, 24-1, 24-2, 24-3, and 24-4 is $L_0+idL'$ where $L_0$ is a common delay line length and dL' (=0.5 dL) is a unit difference length. Note that, as described below, the length dL determines a period of the reflection spectrum (a free spectral range (FSR)) of the reflective phase adjuster 20.

In the case of the first embodiment, the difference length of each of the reflective delay lines 24-0, 24-1, 24-2, 24-3, and 24-4 increases monotonically as the identifier i of the reflective delay lines 24-0, 24-1, 24-2, 24-3, and 24-4 increases. However, the embodiment is not limited to the aspect of such a configuration. For example, as the identifier i increases from 0 to 4, the difference lengths of the reflective delay lines 24-0, 24-1, 24-2, 24-3, and 24-4 may be 3dL', 2dL', 0, 4dL', dL', for example, respectively. Furthermore, it is not necessarily required that the difference lengths are integer multiples of dL'.

For the reflective delay lines 24-0, 24-1, 24-2, 24-3, and 24-4 including the electro-absorption modulators (EAM-0 to EAM-4) 22, $t_i$ denotes an electric field transmittance of reciprocating light and $\beta$ denotes a propagation constant of the light which is common with the multi-mode interference waveguide (MMI) 21. Note that the propagation constant $\beta$ is simplified for the sake of description. In this case, a change in complex electric field when light reciprocates in the reflective delay lines 24-0, 24-1, 24-2, 24-3, and 24-4 is represented by Expression (3) below.

Math. 3

$$t_i \exp(-j\beta 2(L_0 + idL')) \tag{3}$$

A complex reflection spectrum r($\beta$) seen from the input waveguide of the reflective phase adjuster 20 illustrated in FIG. 3 is the sum of the square of Expression (2) above multiplied with Expression (3) for the reflective delay lines 24-0, 24-1, 24-2, 24-3, and 24-4 of the identifier i. That is, the complex reflection spectrum r($\beta$) is represented by Relational Equation (4) below.

Math. 4

$$r(\beta) = \sum_{i=0}^{4} \frac{1}{5} t_i \exp(-j2\beta(L_{MMI} + L_0 + idL')) \tag{4}$$

Note that, in Relational Equation 4, $\Sigma$ is the sum of identifiers i=0 to 4. The absolute value of this Relational Equation 4 has a peak when i2$\beta$dL'=i$\beta$dL (note that the definition dL'=0.5 dL) is an integer multiple of 2$\pi$, and an interval (FSR) between the peaks is c/($n_g$dL) when expressed as the optical frequency, where c denotes a speed of light and $n_g$ denotes a group refractive index of the reflective delay lines 24-0, 24-1, 24-2, 24-3, and 24-4.

The above-described results indicate that the length dL is a parameter determining the interval (FSR) between peaks of the reflective phase adjuster 20. Here, an effective physical length $L_{eff}$ of the system of Relational Equation (4) will be described. The effective physical length $L_{eff}$ is given by a change rate relative to the propagation constant with respect to the phase of light transmitted through the structure. Firstly, in a case of the phase of the complex reflection spectrum r($\beta$), the following Relational Equation (5) is obtained from Relational Equation (4).

Math. 5

$$\tan(\arg(r(\beta))) = -\frac{\sum_{i=0}^{4} t_i \sin(2\beta(L_{MMI} + L_0 + idL'))}{\sum_{i=0}^{4} t_i \cos(2\beta(L_{MMI} + L_0 + idL'))} \tag{5}$$

When only the vicinity of the peak of the electric field reflectance of the complex reflection spectrum r($\beta$) is considered in Relational Equation 5, a phase term of r($\beta$) can be assumed to be sufficiently small, as described above, and thus, tan(arg(r($\beta$))) is represented by Relational Expression (6) below.

Math. 6

$$\tan(\arg(r(\beta))) \approx \arg(r(\beta)) \approx -\frac{\sum_{i=0}^{4} t_i 2\beta(L_{MMI} + L_0 + idL')}{\sum_{i=0}^{4} t_i} = \tag{6}$$

$$-2\beta(L_{MMI} + L_0) - \frac{\sum_{i=0}^{4} t_i 2\beta(idL')}{\sum_{i=0}^{4} t_i}$$

Furthermore, the effective physical length $L_{eff}$ for one way in the reflective phase adjuster 20 illustrated in FIG. 3 is represented by Relational Expression (7) below.

Math. 7

$$L_{eff} = \tag{7}$$

$$-\frac{1}{2}\frac{d\arg(r(\beta))}{d\beta} \approx L_{MMI} + L_0 + \frac{\sum_{i=0}^{4} t_i(idL')}{\sum_{i=0}^{4} t_i} = L_{MMI} + L_0 + L_{eff\_delay}$$

$$L_{eff\_delay} \equiv \frac{\sum_{i=0}^{4} t_i(idL')}{\sum_{i=0}^{4} t_i}$$

In Relational Expression (7), a weighted average value $L_{eff\_delay}$ indicating the difference lengths (idL') of the reflective delay lines 24-0, 24-1, 24-2, 24-3, and 24-4 is added to the sum of the length $L_{MMI}$ and the common delay line length $L_0$ to obtain the effective physical length $L_{eff}$ of the reflective phase adjuster 20. Note that the weighted average value $L_{eff\_delay}$ of the effective physical length $L_{eff}$ may be referred to as "effective delay length".

Here, if a reference refractive index $n_{ref}$ representing the refractive index of the optical gain waveguide 1 constituting the longitudinal mode according to Relational Expression 1 above is used, a longitudinal mode order m can be obtained from Relational Expression (8) below.

Math. 8

$$n_{ref}\left(L_{MMI} + L_0 + L_{eff\_delay}\right) \cong \frac{m\lambda}{2} \tag{8}$$

According to Relational Expression (8), it is understood that if the transmittance (the electrical field transmittance $t_i$) of light in the electro-absorption modulators (EAM-0 to EAM-4) 22 is changed, it is possible to control the effective physical length $L_{eff}$ of the reflective phase adjuster 20 by the unit difference lengths dL'. This indicates that the problem in that the phase adjuster 2 known in the art experiences limitations due to the refractive index change of the wave-guide material can be solved.

In a specific example, in a wavelength band of 1.55 μm, the power transmittance (a square of a norm of the complex reflection spectrum r(β)) of the reflective phase adjuster 20 was calculated as a numerical value in Relational Equation (4). Similarly, the effective delay length $L_{eff\_delay}$ of the reflective delay lines 24-0, 24-1, 24-2, 24-3, and 24-4 of the identifier i was also calculated as a numerical value. Note that here, it is assumed as a precondition that the electric field transmittance $t_i$ of light reciprocating in the reflective delay lines 24-0, 24-1, 24-2, 24-3, and 24-4 of the identifier i is used as a parameter. Under this precondition, the reflective index of the reflective delay lines 24-0, 24-1, 24-2, 24-3, and 24-4 of the identifier i is 3.36 at a wavelength of 1.55 μm, a group refractive index $n_g$ is 3.8, and dL=2dL'=23.96 μm is satisfied.

Figure 4:
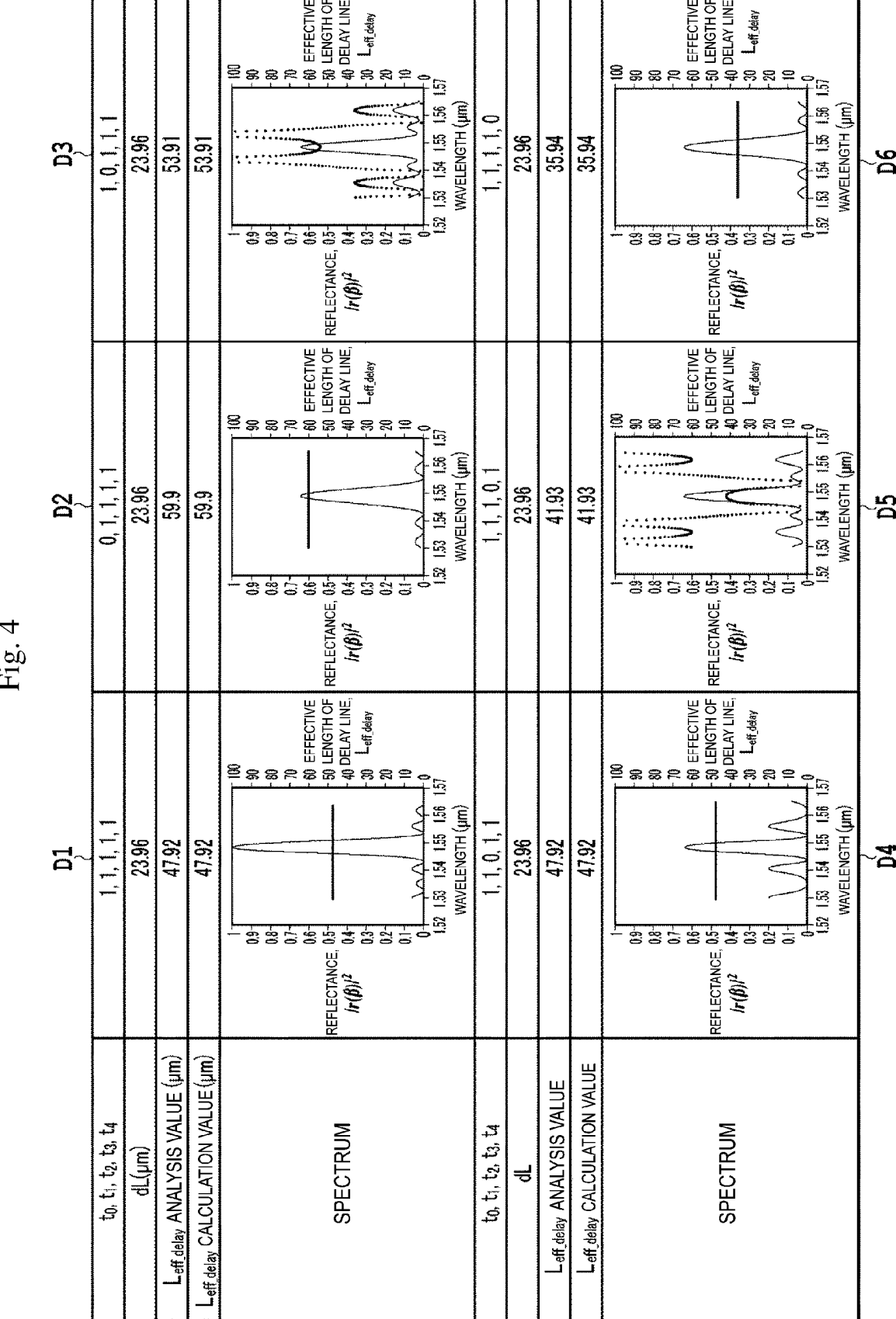
FIG. 4 is a table showing data of calculation results of power reflection spectra and effective optical path lengths when the transmittance of an electric field reciprocating in reflective delay lines of the reflective phase adjuster of FIG. 3 is changed.

FIG. 4 shows results of the numerical calculation described above. In FIG. 4, firstly, the electric field transmittance $t_i$ of light reciprocating in the reflective delay lines 24-0, 24-1, 24-2, 24-3, and 24-4 of the identifier i of the reflective phase adjuster 20 is changed. Subsequently, data D1 to D6 of the calculated results for the power reflection spectrum and the effective optical path length $L_{eff\_delay}$ are shown when the electric field transmittance $t_i$ is changed. Note that $L_{eff\_delay}$ analysis values in FIG. 4 indicate values of the effective delay length $L_{eff\_delay}$ obtained on the basis of Relational Expression (7), which is an approximation model. Furthermore, $L_{eff\_delay}$ calculation values in FIG. 4 indicate values at a reflection peak wavelength of the effective delay length $L_{eff\_delay}$ directly obtained by the numerical calculation for the model of Relational Equation (4).

Referring to FIG. 4, for data D1 to D6 being calculation results, it can be seen that, if the electric field transmittance $t_i$ of the reflective delay lines 24-0, 24-1, 24-2, 24-3, and 24-4 of the identifier i is changed, the effective delay length $L_{eff\_delay}$ changes in different patterns. Furthermore, the $L_{eff\_delay}$ analysis values are in good coincidence with the $L_{eff\_delay}$ calculation values. Here, the difference lengths (idL') of the reflective delay lines 24-0, 24-1, 24-2, 24-3, and 24-4 of the identifier i will be discussed.

For the difference lengths (idL'), the focus is on the weighted average value of the effective delay length $L_{eff\_}$delay with respect to the intensity of light from the reflective delay lines 24-0, 24-1, 24-2, 24-3, and 24-4 of the identifier i. Subsequently, it is possible to confirm the validity of a model in which this effective delay length $L_{eff\_delay}$ is the effective physical length $L_{eff}$ of the entire reflective delay line array 25. It is also understood from data D1 to D6 in FIG. 4 that a wavelength selection spectrum of the reflective phase adjuster 20 according to the first embodiment can be used as a function of a wavelength selection filter 3.

Furthermore, the reflection spectrum adjustment electrodes 23 are arranged between the electro-absorption modulators (EAM-1 to EAM-4) 22 and the mirrors M at the terminal part of the reflective delay line array 25 of the reflective phase adjuster 20. If an appropriate control signal is applied to the reflection spectrum adjustment electrodes 23 as described in NPL 1, the reflective phase adjuster 20 may not only adjust the effective physical length $L_{eff}$, but also the wavelength selection spectrum.

That is, the oscillation wavelength adjustment type TLD according to the first embodiment includes the electro-absorption modulators (EAM-0 to EAM-4) 22 in the reflec-tive delay lines 24-0, 24-1, 24-2, 24-3, and 24-4 of the reflective delay line array 25 in the reflective phase adjuster

10

20. In the reflective delay lines 24-0, 24-1, 24-2, 24-3, and 24-4, it is possible to adjust (the control signal mentioned above being an electric signal from the outside may be used together) the intensity of reciprocating light in accordance with a change in oscillation wavelength (change in trans-mittance) of light transmitted through the reflective delay lines 24-0, 24-1, 24-2, 24-3, and 24-4. As a result, it is possible to adjust the control amount of the resonator length L, independently from physical property values of the wave-guide material when a waveguide is used in the phase adjustment, without using an external resonator structure in accordance with the MEMS technology.

Second Embodiment

In the wavelength adjustment control in the oscillation wavelength adjustment type TLD according to the first embodiment, ideally, it is only required to change the wavelength selection spectrum and the optical path length by the function of the variable wavelength filter 3 and the control by the reflective phase adjuster 20. On the other hand, it is not preferred that a laser resonator loss of the laser resonator structure changes due to such control. In the case of the reflective phase adjuster 20 according to the first embodiment, the transmittance of the reflective delay lines 24-0, 24-1, 24-2, 24-3, and 24-4 of the identifier i is changed, and as a result, the laser resonator loss may also change. However, if a certain condition is satisfied, the optical path length can be changed without changing the laser resonator loss. Thus, in the oscillation wavelength adjustment type TLD according to a second embodiment, the reflective phase adjuster 20 capable of changing the optical path length without changing the laser resonator loss will be described.

It is understood that, in the vicinity of the peak wave-length of the reflective phase adjuster 20, the reflectance is determined only by the total value of the electric field transmittance $t_i$ for the derivation of the complex reflection spectrum r(β) as in Relational Equation (4). Consequently, when the control signal applied to the electro-absorption modulators (EAM-0 to EAM-4) 22 is adjusted in a range where the total value of the electric field transmittance $t_i$ is constant, it is possible to adjust the oscillation wavelength by changing only the optical path length, without changing the reflectance.

Thus, in the second embodiment, in the reflective phase adjuster 20 having the parameters described in the first embodiment, it is assumed that control conditions of the electric field transmittance $t_i$ are set in a case where s (0≤s≤4) denotes a control signal s applied to the reflective phase adjuster 20. The control conditions of the electric field transmittance $t_i$ are expressed by Relational Expression (9) below.

Math. 9

$$t_i = \begin{cases} |s-i|, & |s-i| \le 1 \\ 1, & |s-i| \ge 1 \end{cases} \quad (9)$$

Here, light is absorbed or transmitted in only two succes-sive delay lines of the reflective delay lines 24-0, 24-1, 24-2, 24-3, and 24-4 of the identifier i so that $t_i+t_{i+1}=1$ (0≤i≤3) is established. Specifically, light is absorbed in the electro-absorption modulators (EAM) 22 provided in the reflective delay lines 24-0, 24-1, 24-2, 24-3, and 24-4 of the corresponding identifier i. Furthermore, light is transmitted in the electro-absorption modulators (EAM) 22 other than the above ones.

If the electric field transmittance $t_i$ is changed in accordance with Relational Expression (9), the peak value of the power reflectance of the reflective phase adjuster 20 (power reflectance at a wavelength of 1.5484 μm) and the effective delay length $L_{eff\_delay}$ of the reflective delay line array 25 at that wavelength are also obtained. Note that the power reflectance is obtained by the square of the absolute value of the complex reflection spectrum r(β).

Figure 5:
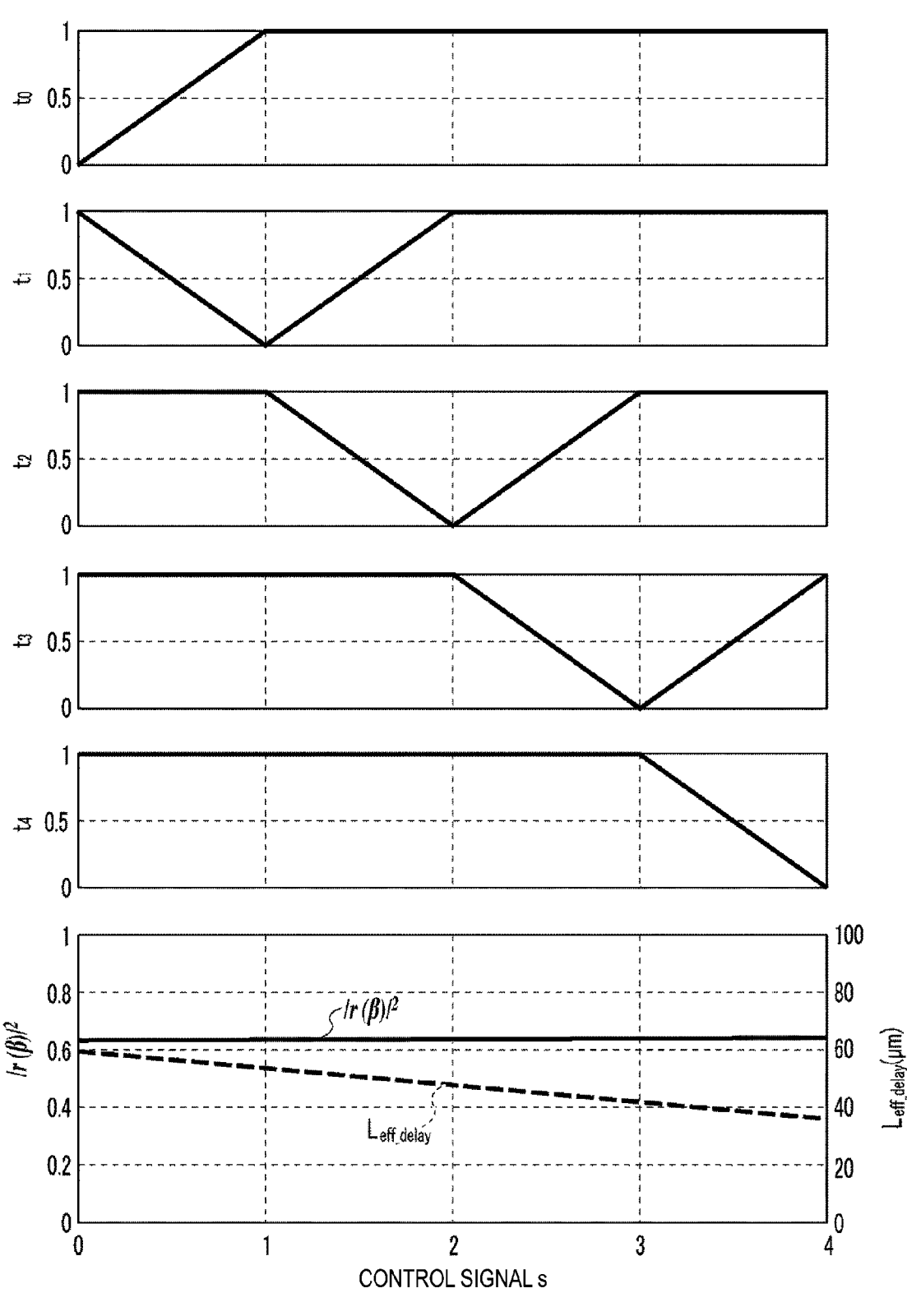
FIG. 5 is a set of graphs showing calculation results of an electric field transmittance value, a power reflectance, and an effective delay length when the electric field transmittance of reflective delay lines provided in a reflective phase adjuster according to a second embodiment of the present invention is changed.

FIG. 5 is a set of graphs showing calculation results of values of the electric field transmittances $t_0$ to $t_4$, the power reflectance, and the effective delay length $L_{eff\_delay}$ when the electric field transmittance $t_i$ of the reflective delay lines 24-0, 24-1, 24-2, 24-3, and 24-4 provided in the reflective phase adjuster 20 according to the second embodiment of the present invention is changed. The power reflectance is obtained by the square of the absolute value of the complex reflection spectrum r(β) correspondingly to the values of the electric field transmittances $t_0$ to $t_4$. The effective delay length $L_{eff\_delay}$ indicates the effective optical path length of the reflective delay line array 25 at these wavelengths. Note that, here, the electric field transmittance $t_i$ is changed by applying the control signal s to the electro-absorption modulators (EAM-0 to EAM-4) 22.

Referring to FIG. 5, it can be seen from the results calculated when the electric field transmittance $t_i$ is changed in accordance with Relational Expression 9, that the power reflectance is constant with respect to the control signal s, but the effective delay length $L_{eff\_delay}$ changes continuously from 59.9 μm to 35.94 μm.

Here, the usability of the reflective phase adjuster 20 will be discussed with reference to a difference between the reflective phase adjuster 20 and the phase adjuster 2 known in the art described with reference to FIG. 1. The effective physical length $L_{eff}$ of the reflective phase adjuster 20 is represented by $L_{MMI}+L_0+L_{eff\_delay}$ in Relational Expression 8. Furthermore, in the multi-mode interference waveguide (MMI) 21 having one input port and five output ports, a length $L_{MMI}$=150 μm is employed as a size that can be easily produced. When the electro-absorption modulators (EAM-0 to EAM-4) 22 are used, it is sufficient that the common delay line length $L_0$ is about $L_0$=100 μm. As described with reference to FIG. 5, assuming that the average value of the effective delay length $L_{eff\_delay}$ is (59.9+35.94)/2=47.92 μm (change amount±11.98 μm), the overall change rate of the effective physical length $L_{eff}$ of the reflective phase adjuster 20 is ±11.98/(150+100+47.92), which is about ±4.02%.

On the other hand, the change in optical path length of the phase adjuster 2 known in the art (product of the refractive index $n_k$ and the physical length $L_k$) is proportional to the change of the refractive index $n_k$, and thus, is not higher than about 0.3% in the case of a semiconductor. Consequently, it is possible to achieve a change in optical path length on a larger order than that in a method of controlling the refractive index as in a phase modulator 2 known in the art because of the magnitude of the change of the effective physical length $L_{eff}$ in the reflective phase adjuster 20. As described above, this means that a large amount of continuous wavelength adjustment is achieved. This enables great contribution to the expansion of the sampling wavelength width when the TLD is employed in gas sensing and the expansion of the temperature range when the TLD is used as an athermal laser.

That is, the electro-absorption modulators (EAM-0 to EAM-4) 22 according to the second embodiment are provided in at least two or more reflective delay lines of the reflective delay lines 24-0, 24-1, 24-2, 24-3, and 24-4. Thus, when $t_i$ (i=0, 1, 2, ..., N−1) is the electric field transmittance of the reciprocating light, the intensity of the reciprocating light can be controlled so that the total value of the electric field transmittance $t_i$ is always constant.

The oscillation wavelength adjustment type TLD according to the second embodiment including such a reflective phase adjuster 20 exhibits an operation and effect similar to that in the first embodiment, and further, can change the optical path length without changing the laser resonator loss.

Third Embodiment

In the first and second embodiments, the method of controlling the transmittance of light reciprocating in the reflective delay lines 24-0, 24-1, 24-2, 24-3, and 24-4 included in the reflective delay line array 25 of the reflective phase adjuster 20 includes controlling the electric field transmittance $t_i$. This requires a configuration in which the reflective delay lines 24-0, 24-1, 24-2, 24-3, and 24-4 include the electro-absorption modulators (EAM-1 to EAM-4) 22. In a configuration of the third embodiment, a design of the mirrors M is adapted on the assumption that the electric field transmittance $t_i$ changes with the wavelength of light, and wavelength-dependent mirrors (DBR-0 to DBR-4) 27 of a reflector having a wavelength dependent on a photoelectric field reflectance $r_i$ (i=0, 1, 2, ..., N−1) are provided. Note that, here, a case where the wavelength-dependent mirrors (DBR-0 to DBR-4) 27 are employed for the reflector is described in an example, but other filter structures such as an etalon filter instead of the wavelength-dependent mirrors (DBR-0 to DBR-4) 27 may be applied as wavelength-dependent reflectors.

Figure 6:
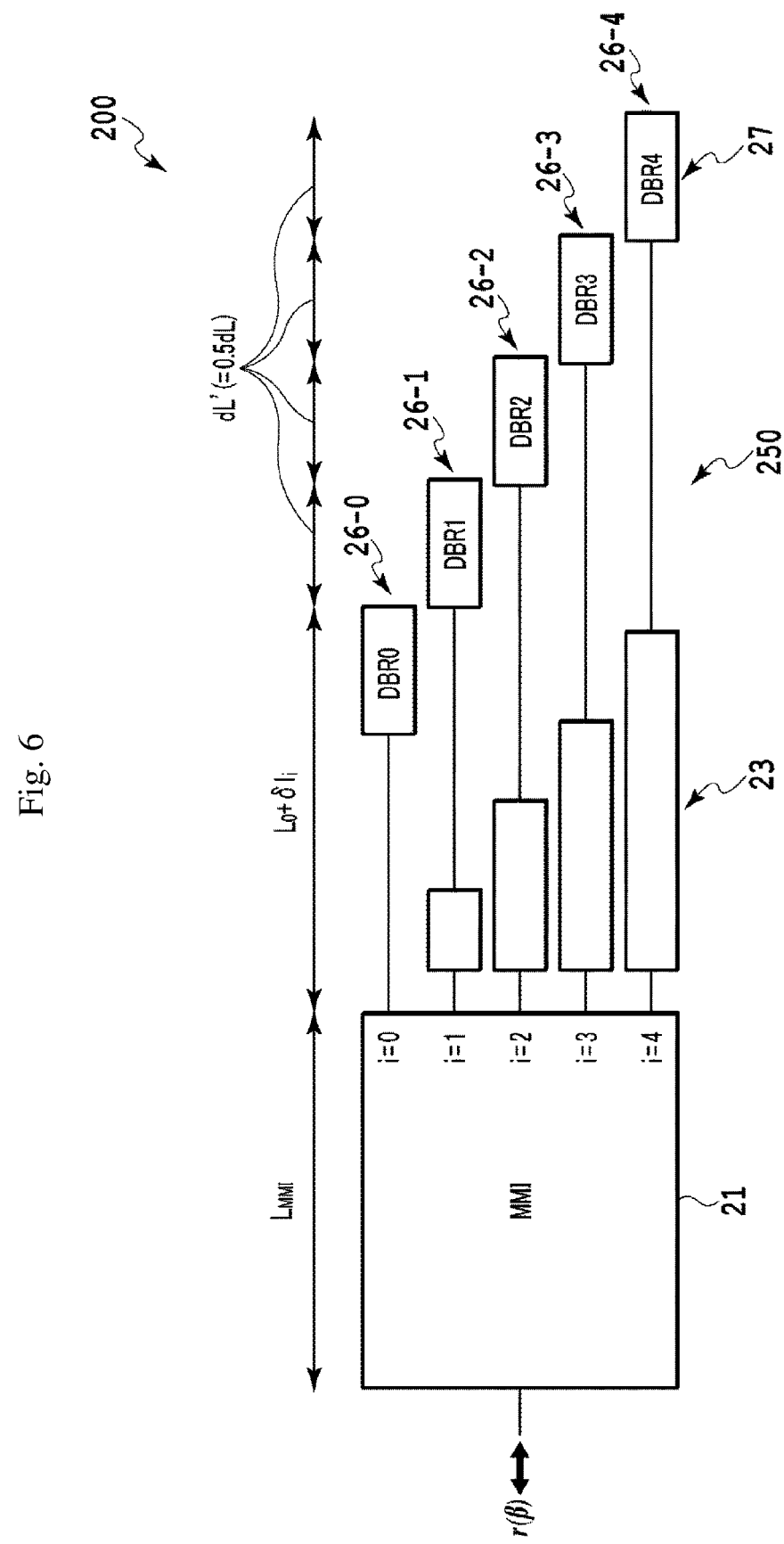
FIG. 6 is a schematic diagram illustrating a schematic configuration of a reflective phase adjuster used in an oscillation wavelength adjustment type TLD according to a third embodiment of the present invention.

FIG. 6 is a schematic diagram illustrating a schematic configuration of a reflective phase adjuster 200 used in the oscillation wavelength adjustment type TLD according to the third embodiment of the present invention.

Referring to FIG. 6, the reflective phase adjuster 200 includes the multi-mode interference waveguide (MMI) 21 configured to include one input port and five output ports. Furthermore, the reflective phase adjuster 200 includes a reflective delay line array 250 connected to an output waveguide on a side of the five output ports of the multi-mode interference waveguide (MMI) 21. The reflective delay line array 250 includes five reflective delay lines 26-0, 26-1, 26-2, 26-3, and 26-4 having a length different from each other and being provided with the wavelength-dependent mirrors (DBR-0 to DBR-4) 27 at terminal parts thereof. Note that the five output ports are also identified by identifier i=0, 1, 2, 3, 4.

The reflection spectrum adjustment electrodes 23 are interposed between the wavelength-dependent mirrors (DBR-1 to DBR-4) 27 corresponding to the reflective delay lines 26-1, 26-2, 26-3, and 26-4 and the four output ports (i=1, 2, 3, 4) of the multi-mode interference waveguide (MMI) 21. Note that, also in the case of the reflective phase adjuster 200 used for the oscillation wavelength adjustment type TLD according to the third embodiment, a case where M input=1 and N output=5 is described in an example, but other numbers of N input and M output may be employed.

Figure 7:
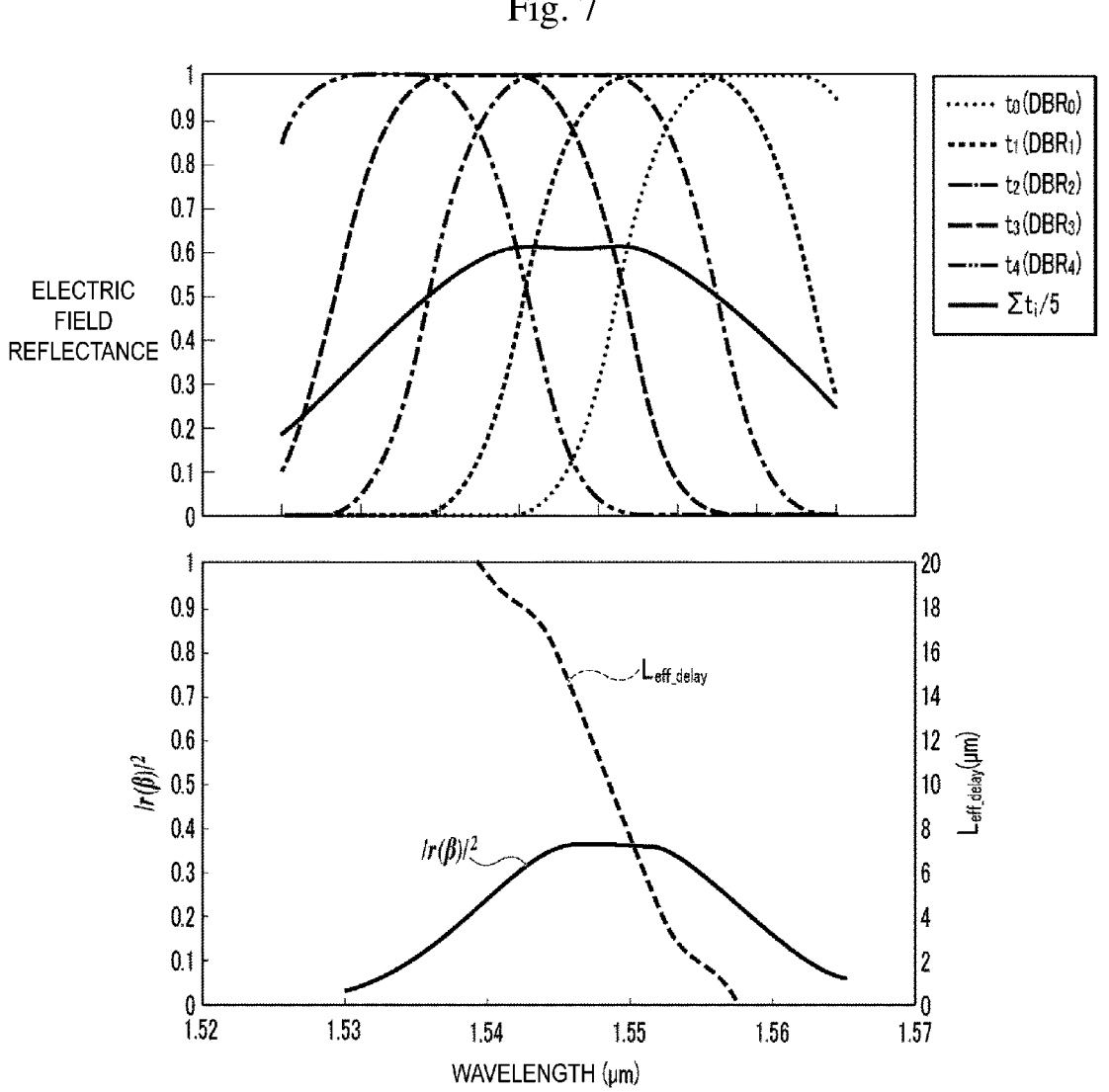
FIG. 7 is a set of graphs showing calculation results of an electric field reflectance, a power reflectance, and an effective delay length of wavelength-dependent mirrors of the reflective delay lines provided in the reflective phase adjuster of FIG. 6.

FIG. 7 is a set of graphs showing calculation results of an electric field reflectance, a power reflectance, and an effective delay length of the wavelength-dependent mirrors (DBR-1 to DBR-4) 27 of the reflective delay lines 26-0, 26-1, 26-2, 26-3, and 26-4 provided in the reflective phase adjuster 200. The power reflectance is obtained by the square of the absolute value of the complex reflection spectrum r(β) correspondingly to the values of the electric field transmittances $t_0$ to $t_4$. The effective delay length $L_{eff\_delay}$ indicates the effective optical path length of the reflective delay line array 250 at these wavelengths. Note that, here, calculation results obtained by approximating the electric field reflection spectrum of the wavelength-dependent mirrors (DBR-1 to DBR-4) 27 by a second-order super Gaussian are shown.

Furthermore, reflection peak wavelengths of the wavelength-dependent mirrors (DBR-1 to DBR-4) 27 are adjusted so that the total of the electric field transmittances $t_0$ to $t_4$ (indicated as an average value in FIG. 7) is constant in the vicinity of a wavelength of 1.55 μm. Furthermore, the electric field transmittance $t_i$ in Relational Equation 4 is substituted by the reflection spectrum, and consequently, the effective delay length $L_{eff\_delay}$ and the power reflection spectrum of the reflective phase adjuster 200 are obtained. In addition, here, the length dL is about 5.068 μm, and the effective physical length $L_{eff}$ of the wavelength-dependent mirrors (DBR-1 to DBR-4) 27 originally changes in accordance with the wavelength, but this change is ignored here for the sake of simplifying the description.

Referring to FIG. 7, it can be seen that the power reflectance is flat near the peak whereas the effective delay length $L_{eff\_delay}$ decreases as the wavelengths of the spectrum is longer. This is because, as the order of the reflective delay lines 26-1, 26-2, 26-3, and 26-4 of the identifier i increases as in the configuration of the reflective phase adjuster 200, the peak wavelength of the corresponding wavelength-dependent mirrors (DBR-1 to DBR-4) 27 decreases. That is, in change from short to long wavelengths in the reflective phase adjuster 200, the ratio of light reflected from the reflective delay lines 26-1, 26-2, 26-3, and 26-4 of the identifier i having a small delay amount increases. This is in comparison to a ratio of light reflected from the reflective delay lines 26-1, 26-2, 26-3, and 26-4 of the identifier i having a large delay amount. These features indicate that the reflective phase adjuster 200 is useful to realize athermal lasers described in the known art.

Figure 8:
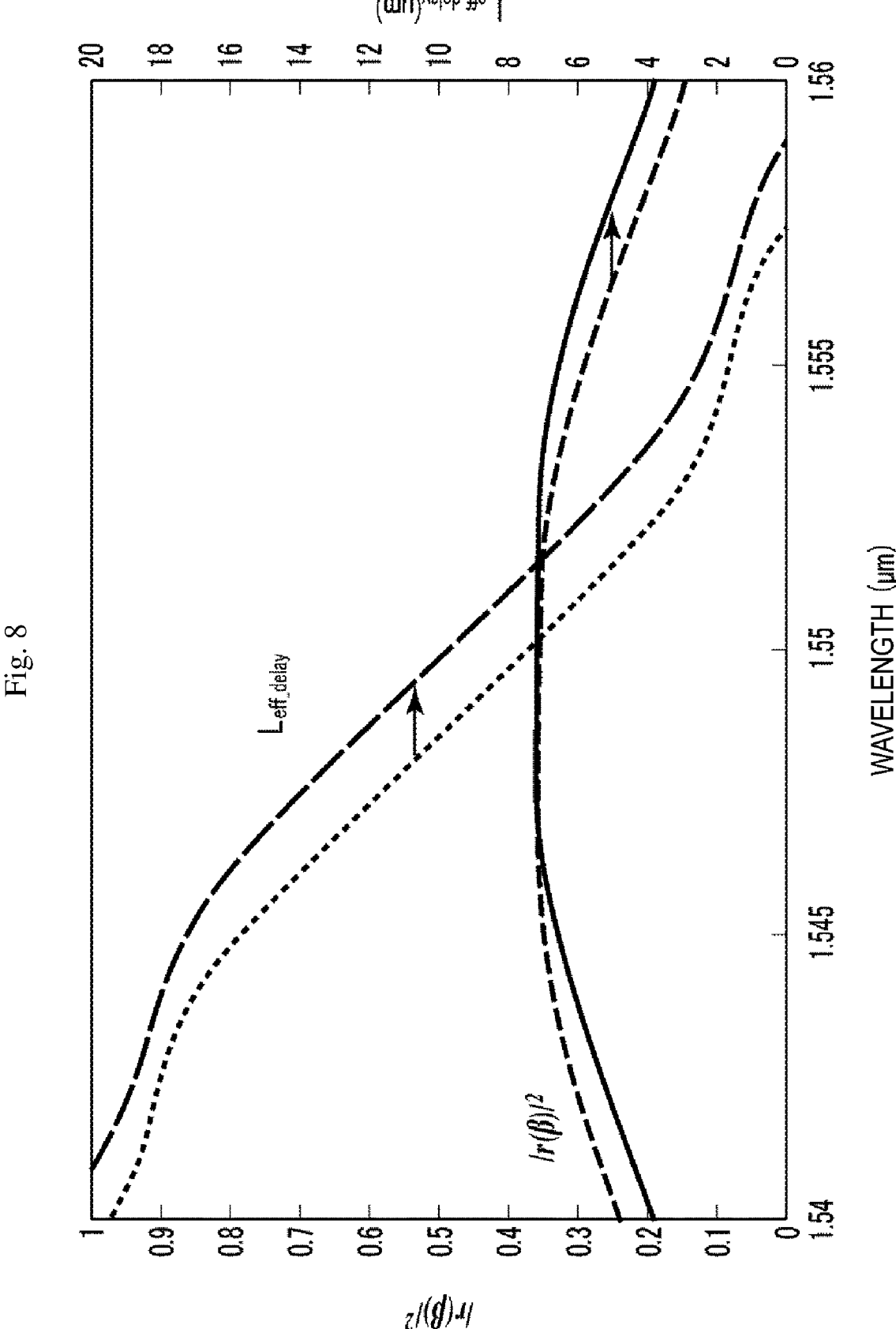
FIG. 8 is a graph showing calculation results of the power reflectance and the effective delay length when the refractive index used in the calculation of FIG. 7 is increased by 0.1% over all wavelengths.

FIG. 8 is a graph showing calculation results of the power reflectance and the effective delay length $L_{eff\_}$delay in a case where the refractive index used in the calculation in FIG. 7 is increased by 0.1% over all wavelengths (corresponding to an increase in temperature in a semiconductor).

Referring to FIG. 8, also in the case where the refractive index is increased by 0.1% over all wavelengths, in accordance with the features shown in FIG. 7, the spectrum of the power reflectance shifts to the right, as indicated by an arrow in FIG. 8, and is flat near the peak. From this appearance, it can be seen that, even when the temperature changes, the power reflectance hardly changes within a certain wavelength range.

On the other hand, it can be seen that the effective delay length $L_{eff\_delay}$ (which can be regarded as the effective physical length $L_{eff}$) reflects the downward-sloping curve in FIG. 7, and decreases by about 2 μm (about 20%) at the same wavelength. That is, the effective physical length $L_{eff}$ decreases by 20% when the refractive index increases by +0.1%, and thus, it is seen that the optical path length of the reflective phase adjuster 200 decreases as the temperature increases. Consequently, in Relational Expression 8, when the reference refractive index $n_{ref}$ increases with an increase in temperature, it is only required to select the length dL so that the change of the reference refractive index $n_{ref}$ is compensated by the change of the effective delay length $L_{eff\_delay}$ with temperature. In such a case, it is possible to realize an athermal laser having an unchanged longitudinal mode order m even if the temperature changes.

That is, the wavelength-dependent mirrors (DBR-0 to DBR-4) 27 according to the third embodiment are adjusted so that the total value of the photoelectric field reflectance $r_i$ is always constant in a wavelength section where the peak wavelength and the shape of the reflection spectrum are constant. The oscillation wavelength adjustment type TLD according to the third embodiment including the reflective phase adjuster 200 corresponds to a case where a change in transmittance at the oscillation wavelength of the light in the first embodiment is replaced with a change in reflectance. That is, it is possible to adjust (to be used together with the control signal mentioned above being an electric signal from the outside) the intensity of reciprocating light in accordance with a change in oscillation wavelength (a change in reflectance) of transmitted light. As a result, in the oscillation wavelength adjustment type TLD according to the third embodiment, it is also possible to adjust the control amount of the resonator length L, independently from physical property values of the waveguide material when a waveguide is used in the phase adjustment, without using an external resonator structure in accordance with the MEMS technology.

The invention claimed is:

1. An oscillation wavelength adjustment type tunable laser diode comprising:

an optical gain waveguide configured to generate and amplify light;

a multi-mode interference waveguide configured to include M input ports and N output ports (where M is a natural integer and N is a positive integer equal to or greater than 2); and a reflective delay line array including N reflective delay lines connected to a side of the N output ports of the multi-mode interference waveguide, each of N reflective delay lines being terminated by a reflector configured to reflect the light, the optical gain waveguide, the multi-mode interference waveguide, and the reflective delay line array being integrated on a top surface of an identical substrate, wherein each of the N reflective delay lines is provided with an electro-absorption modulator, and when $t_i$ (i=0, 1, 2, . . . , N−1) denotes an electric field transmittance of reciprocating light in each of the N reflective delay lines, each of the electro-absorption modulator is configured to control an intensity of the reciprocating light so that a total value of the electric field transmittance $$\left( \sum_{i=0}^{N-1} t_i \right)$$

is constant, and wherein the N reflective delay lines are configured to adjust the intensity of the reciprocating light in accordance with a wavelength of the light transmitted through the N reflective delay lines.

2. The tunable laser diode according to claim 1, wherein the N reflective delay lines are configured to adjust the intensity of the reciprocating light by an electric signal applied from outside.

3. An oscillation wavelength adjustment type tunable laser diode comprising:

an optical gain waveguide configured to generate and amplify light;

a multi-mode interference waveguide configured to include M input ports and N output ports, where M is a natural integer and N is a positive integer equal to or greater than 2; and a reflective delay line array including N reflective delay lines connected to a side of the N output ports of the multi-mode interference waveguide, each of N reflective delay lines being terminated by a reflector configured to reflect the light, wherein the optical gain waveguide, the multi-mode interference waveguide, and the reflective delay line array being integrated on a top surface of an identical substrate, each reflector of the N reflective delay lines having a wavelength dependent electric field reflectance $r_i$ (i=0, 1, 2, . . . , N−1) of reciprocating light in each of the N reflective delay lines, and a peak wavelength and a shape of a reflection spectrum of the each reflector are adjusted so that a total value of the electric field reflectance $$\left( \sum_{i=0}^{N-1} r_i \right)$$

is constant in a certain wavelength section.

\*  \*  \*  \*  \*